United States Patent

Gossner

(10) Patent No.: US 8,934,576 B2
(45) Date of Patent: Jan. 13, 2015

(54) DEMODULATION METHOD

(75) Inventor: Kai Gossner, Neukirchen-Vluyn (DE)

(73) Assignee: KROHNE Messtechnik GmbH, Duisburg (DE)

(*) Notice: Subject to any disclaimer, the term of this patent is extended or adjusted under 35 U.S.C. 154(b) by 1024 days.

(21) Appl. No.: 13/014,064

(22) Filed: Jan. 26, 2011

(65) Prior Publication Data

US 2012/0057170 A1 Mar. 8, 2012

(30) Foreign Application Priority Data

Sep. 2, 2010 (DE) .......................... 10 2010 044 245

(51) Int. Cl.
*H03K 9/00* (2006.01)
*H04L 27/22* (2006.01)
*H03D 3/00* (2006.01)

(52) U.S. Cl.
CPC .............. *H04L 27/223* (2013.01); *H03D 3/006* (2013.01); *H03D 2200/0062* (2013.01)
USPC ........................................ 375/316

(58) Field of Classification Search
USPC .................... 375/316; 356/477, 498; 704/278
See application file for complete search history.

(56) References Cited

U.S. PATENT DOCUMENTS

| | | | |
|---|---|---|---|
| 5,313,266 A * | 5/1994 | Keolian et al. | 356/477 |
| 5,933,808 A * | 8/1999 | Kang et al. | 704/278 |
| 6,363,034 B1 | 3/2002 | Varnham | |
| 6,496,265 B1 | 12/2002 | Duncan et al. | |
| 6,944,231 B2 | 9/2005 | Scrofano | |
| 7,339,678 B2 | 3/2008 | Hall et al. | |
| 2002/0021449 A1* | 2/2002 | Demarest | 356/498 |
| 2003/0063679 A1 | 4/2003 | Scrofano | |
| 2007/0103692 A1 | 5/2007 | Hall et al. | |
| 2008/0033932 A1 | 2/2008 | DeLong et al. | |
| 2010/0038827 A1 | 2/2010 | Nimmakayala et al. | |

FOREIGN PATENT DOCUMENTS

WO 92/01208 A1 1/1992

* cited by examiner

*Primary Examiner* — Daniel Washburn
*Assistant Examiner* — Fitwi Hailegiorgis
(74) *Attorney, Agent, or Firm* — Roberts Mlotkowski Safran & Cole, P.C.; David S. Safran

(57) ABSTRACT

A demodulation method for a pseudo-heterodyne signal, wherein the pseudo-heterodyne signal has a phase-modulated carrier signal and the pseudo-heterodyne signal is digitally sampled. A demodulation method at least partially avoids the disadvantages known from the prior art is implemented according to the invention in that the digitally sampled pseudo-heterodyne signal is subjected to a discrete Fourier transformation and at least one output Fourier coefficient featuring an amplitude and a phase is determined, an atan2 function (11) is applied on exactly one output Fourier coefficient of the discrete Fourier transformation and the atan2 function (11) provides the phase of the one output Fourier coefficient as a result.

12 Claims, 4 Drawing Sheets

DEMODULATION METHOD

BACKGROUND OF THE INVENTION

1. Field of the Invention

The invention relates to a demodulation method for a pseudo-heterodyne signal, wherein the pseudo-heterodyne signal has a phase-modulated carrier signal and the pseudo-heterodyne signal is digitally sampled.

2. Description of Related Art

A pseudo-heterodyne signal is designated as a signal emitted from an interferometer that is based on a pseudo-heterodyne method. As is generally known, with an interferometer, two sufficiently temporal coherent—i.e., capable of interference—beams are brought into interference. In principal, the beam of a coherent beam source is split with a beam splitter into a first partial beam and a second partial beam. The paths that the first partial beam and the second partial beam take are called the arms of the interferometer. At the exit of the interferometer, the partial beams are brought together and brought into interference (or beams are brought into interference that are derived from partial beams—depending on the construction of the interferometer). The intensity of the beam at the exit of the interferometer is proportional to the cosine of the phase difference between both interfering partial beams. Changes in the phase difference, e.g., caused by minimal changes in the length of an interferometer arm, thus lead to a change in the intensity at the exit of the interferometer.

In the pseudo-heterodyne method described in the introduction, the phase difference between both partial beams interfering in the interferometer is modulated with a periodic sawtooth signal. Generally, other types of signals are possible, but the use of a sawtooth signal is the best-known and most widely used method, so that the description in the following is directed toward the use of a sawtooth signal, however, the invention is not limited thereto. A signal z(t) is denoted as a sawtooth signal which can be described using the following Fourier series:

$$z(t) = a \sum_{k=1}^{\infty} \frac{\sin(2\pi k f_0 t)}{k} \qquad \text{Equation 1}$$

Here, a is a scaling factor that is not zero, $f_0$ is the frequency of the periodic sawtooth signal and t is time. As can be seen from the Fourier series of the sawtooth signal z(t), frequencies occur that correspond to an integer multiple of the frequency $f_0$. The phase difference signal, which arises from the modulation of the, assumed to be constant, phase difference with the known sawtooth signal z(t), is superimposed with the actual, wanted signal s(t) of interest, which basically exists in the phase change of a partial beam in an arm of the interferometer—caused in any manner. The intensity signal at the exit of the interferometer is now the pseudo-heterodyne signal. As the wanted signal vanishes, the pseudo-heterodyne signal is transferred in the non-modulated carrier signal, which is essentially made up of periodical repetitions of sine-shaped sections. The frequency of the periodical repetition of the repetitive sine-shaped sections is denoted as the frequency of the carrier signal here. This frequency corresponds to the frequency $f_0$ of the periodic sawtooth signal z(t). If a wanted signal is present, the carrier signal is phase modulated by the wanted signal.

Mach Zehnder interferometers are a type of interferometer that is often used. Other types of interferometers, for example, Michelson interferometers, are also basically possible to use. Semiconductor lasers are particularly suitable for creating the beam used in the interferometer, such as, e.g., a VCSEL (Vertical-Cavity Surface-Emitting Laser). The advantage of semiconductor lasers is that modulation of the phase difference between both interfering partial beams in the interferometer can be particularly easily implemented. Here, the characteristic of semiconductors is used that the wavelength of the laser beam emitted from the semiconductor laser is dependent on the pumping current. In this manner, the wavelength of the laser beam can be modulated with the desired sawtooth signal z(t) by amplitude modulation of the pumping current with a corresponding signal. The change of the phase difference $d\phi$ between both interfering partial beams in the interferometer is linearly related to the change of the frequency of the laser beam dv at a present path length difference l of both partial beams:

$$d\phi = \frac{2\pi n l}{c} dv \qquad \text{Equation 2}$$

Here, n is the average refractive index along the path of the path length difference 1 and c denotes the vacuum speed of light. Thus, the result is that the phase difference between both interfering partial beams in the interferometer can be modulated onto the desired sawtooth signal z(t) by corresponding modulation of the pumping current of the semiconductor laser. This modulation method only works for non-vanishing path length differences l of both partial beams. The advantage of this modulation method is that a movable and susceptible component is not needed for modulation of the phase difference between both interfering partial beams in the interferometer, rather only electronic components are used.

The pseudo-heterodyne signal, which is initially present as an intensity signal at the exit of the interferometer, is normally transformed into an electric signal, for example, by a photo diode, in particular a PIN photo diode. Then, after possible amplification, this electric signal is digitally sampled. Digital sampling is carried out in particular by an analog-digital converter. A possible planned amplification can also occur directly by the PIN photo diode.

The above-described interferometric method for creating a pseudo-heterodyne signal is, for example, suitable for such applications in which small deflections are detected, wherein the interferometer is used in such a manner that the deflection to be detected leads to a path length change of an interferometer arm; as a result deflections in a (sub-)wavelength range of the beam source used can be easily detected. The method is thus used insofar, for example, in the field of vibration measurement, in particular, in vibration measuring devices or in measuring devices that detect mechanical oscillation, wherein the type or change of the detected oscillation can lead to conclusions about other interesting factors. Vortex flow measurement, for example, is possible as such an application. In the following, this application will be described as an example. This, of course, does not limit the method according to the invention, but rather a variety of other application possibilities are possible, e.g., application in acoustic sensors.

The volume flow of gases, vapors and liquids in piping systems can be measured with a vortex flowmeter. The measuring principal is based on the principal of the Kármán vortex street. In the measuring tube, an obstruction is found that the medium flows around and behind which a vortex is shed. The frequency f of the vortex shedding is proportional to the flow velocity v of the medium. The dimensionless Strouhal number S describes the relation between vortex frequency f, width b of the obstruction and the average flow velocity v of the medium:

$$f = \frac{S \cdot v}{b} \qquad \text{Equation 3}$$

The vortexes spreading behind the obstruction in the direction of flow act upon a probe found behind the obstruction in the direction of flow, such as, e.g., a membrane or a rod-shaped probe. The probe is periodically deflected by the vortex with the frequency f, which represents the wanted signal. This deflection can, for example, be transferred mechanically to a mirror of an interferometer arm, it can also be directly detected by an optical fiber, which is attached to the deflectable membrane and is subject to a length change corresponding to the deflection. The deflection detected in this manner is responsible for a periodic change of the phase difference between both interfering partial beams in the interferometer. This periodic change of the phase difference corresponds to the wanted signal of interest.

Such a vortex flowmeter is known from International Patent Application Publication WO 92/01208. The demodulation of the pseudo-heterodyne signal occurs here using a phase locked loop (PLL). It has been shown to be disadvantageous in this demodulation method that the phase locked loop can set itself to higher harmonics of the pseudo-heterodyne signal and jumps between different harmonics. This strongly impacts the quality of the signal. The higher harmonics can be removed from the pseudo-heterodyne signal, but this increases the effort in terms of circuits.

Since, in the area of the tip of a sawtooth of the sawtooth signal z(t), the amplitude of the pumping current falls step-like after having achieved the maximum amplitude, this normally leads to a step-like change of the pseudo-heterodyne signal. In a possible provided amplification of the pseudo-heterodyne signal, the step-like change of the pseudo-heterodyne signal can be detected with little disturbance with an amplifier that has a high bandwidth, i.e., the step response of the amplifier leads to relatively little disturbance. An amplifier with a high bandwidth, however, normally has an undesired high energy consumption, so that the above-described technology practically cannot be used in devices, which, according to regulations, are only allowed to have a very small maximum power input, for example, two-wire devices with a current interface (4 mA-20 mA).

SUMMARY OF THE INVENTION

Thus, a primary object of the invention is to provide a demodulation method that at least partially avoids the disadvantages of the prior art, and at least, provides an alternative to the method known from the prior art.

The above derived and described object is met based on the demodulation method described in the introduction in that the digitally sampled pseudo-heterodyne Signal is subjected to a discrete Fourier transformation and at least one output Fourier coefficient having an amplitude and phase is determined, one atan2 function is used on exactly one output Fourier coefficient of the discrete Fourier transformation and the atan2 function provides the phase of the one output Fourier coefficient as a result. Since each Fourier coefficient of a Fourier transformation includes phase information, it is sufficient to calculate only one Fourier coefficient. Here, the atan2 function is a function that when used on a complex number, such as, e.g., a Fourier coefficient of a discrete Fourier transformation, provides the phase of this complex number. Since the pseudo-heterodyne signal is phase modulated with the wanted signal, the wanted signal can be obtained in a known manner from the phase information of the output Fourier coefficient, which is provided by the atan2 function.

In general, it is possible to use the atan2 function on an arbitrary output Fourier coefficient, since all output Fourier coefficients contain phase information. According to an advantageous further development of the invention, however, it is provided that the one output Fourier coefficient is the second Fourier coefficient of the discrete Fourier transformation.

An advantageous design of the invention is characterized in that an algorithm for fast Fourier transformation is used for creating the discrete Fourier transformation. With an algorithm for fast Fourier transformation, which is normally abbreviated as FFT (fast Fourier transform), an algorithm is intended that can calculate the discrete Fourier transformation in accordance with the "divide and conquer" principle exceptionally quickly. In particular, it is advantageous to adapt the used algorithm to the special form of the discrete Fourier transformation to be calculated in order to, thus, achieve a further increase in velocity.

According to a particularly advantageous further development of the invention, it is provided that the pseudo-heterodyne signal is created during m oscillations of the carrier signal, the pseudo-heterodyne signal is sampled with the m*n-fold frequency of the carrier signal, wherein m is a natural number greater than zero and n is a natural number greater than one and the discrete Fourier transformation is carried out over m*n sampling steps. That the pseudo-heterodyne signal is created during m oscillations of the carrier signal means that the modulation of the phase difference between both interfering partial beams in the interferometer occurs with such a sawtooth signal that the periodically-repeating, sine-shaped sections of the carrier signal each correspond to m oscillations of a sine oscillation. This can be achieved by a suitable choice of the slope of the teeth of the sawtooth signal z(t). The slope of the teeth of the sawtooth signal z(t) can be adjusted via the scaling factor a (see, equation 1).

In a preferred design of the invention, it is provided that the pseudo-heterodyne signal is created during (m+p/n)-oscillations of the carrier signal, the pseudo-heterodyne signal is sampled with the m*n+p-fold frequency of the carrier signal, wherein m is a natural number greater than zero, n is a natural number greater than one and p is a natural number greater than zero, the discrete Fourier transformation is carried out over m*n scanning steps and the first p scanning steps are discarded.

By discarding one of the m*n+p scanning steps, a part of the periodically-repeating, sine-shaped section can be hidden. Since the disturbances by the step response of an amplifier always occur immediately after the step-like change of the pseudo-heterodyne signal, according to the invention, exactly that part of the periodically repeating, sine-shaped section is chosen, here, which includes the disturbances caused by the step response of the amplifier. This part normally corresponds to the first p scanning steps of the m*n+p scanning steps. These first p scanning steps are not taken into account in the following discrete Fourier transformation, i.e., are discarded. The remaining m*n scanning steps are used for the discrete Fourier transformation. The remaining part of the periodically repeating, sine-shaped section now represents exactly m periods of a sine oscillation. This remaining, exceptionally little disturbed part is evaluated according to the invention with the atan2 function. Consequently, an amplifier can be used with a low bandwidth and thus low power consumption, since the disturbances caused by the step response of the amplifier is nearly completely suppressed.

All in all, it has been determined that the possibility has been created by the method according to the invention for implementing interferometric applications even in such devices, which, according to regulations, are only allowed to have a very small maximum power input, for example, two-wire devices with a current interface (4 mA-20 mA).

With a given number m and a given number n, the optimal value of the number p can be determined as follows. The value of the number p is denoted as optimal exactly when the number p is just big enough that the disturbances created by the step response of the amplifier is suppressed. In order to determine the optimal value of the number p, the total duration $t_d$ of the periodically repeating, sine-shaped section and the duration $t_{sr}$ of the to be suppressed disturbances are determined. With the knowledge of these two durations and the given number m as well as the given number n, the optimal value of the number p can be determined according to the following equation 4:

$$p = \left\lceil \frac{m \cdot n \cdot t_{sr}}{(t_d - t_{sr})} \right\rceil \quad \text{Equation 4}$$

Here, the ceiling function is symbolized by the superscript bracket, so that the value of p always results as an integer value according to equation 4.

According to a further preferred design of the invention, it is provided that the number n is chosen to equal four. Furthermore, it is advantageous when the number m is chosen to equal one. In a particularly advantageous design of the invention, it is provided that the number p is chosen to equal one.

According to a further preferred design of the invention, it is provided that the pseudo-heterodyne signal is amplified by an amplifier before digital sampling. The amplification of the pseudo-heterodyne signal before digital sampling is necessary, in particular when the signal strength is not sufficient for an error-free digital scan.

In an advantageous design of the invention, it is provided that the pseudo-heterodyne signal is filtered by a low-pass filter before digital sampling. By using a low-pass filter before the digital sampling of the pseudo-heterodyne signal, possible disturbing higher harmonics of the pseudo-heterodyne signal can be filtered out. This allows, in particular, to suppress aliasing effects effectively.

According to a further advantageous design of the invention, it is provided that phase steps in the phase of one output Fourier coefficient is removed by phase unwrapping. Phase changes, which are greater than $2\pi$, can be managed with a phase unwrapping algorithm. Such algorithms are adequately known from the prior art.

In detail, there are a number of possibilities for designing and further developing the demodulation method according to the invention as will be apparent from the following detailed description of preferred embodiments of the invention with reference to the accompanying drawings.

DETAILED DESCRIPTION OF THE INVENTION

Figure 1:
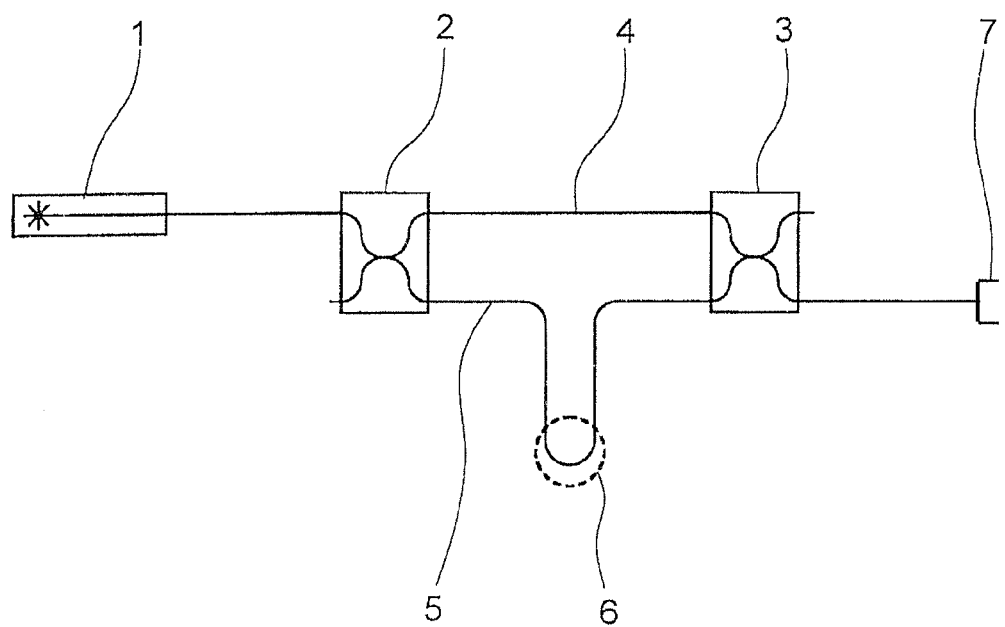
FIG. 1 schematically depicts an interferometer based on a pseudo-heterodyne method, FIG. 2 schematically depicts a demodulation method according to the invention shown with a preferred embodiment, FIG. 3 schematically depicts a further preferred embodiment of a demodulation method according to the invention.

An interferometer based on a pseudo-heterodyne method can be seen schematically in FIG. 1, having a semiconductor laser 1, a first beam splitter 2, a second beam splitter 3, a first interferometer arm 4 and a second interferometer arm 5. The semiconductor laser 1 creates a modulated laser signal sawtooth-shaped in the frequency, which is led to the first beam splitter 2. The first beam splitter 2 splits the laser signal into two partial beams, which are led to the first interferometer arm 4 or the second interferometer arm 5.

The second interferometer arm 5, which has a length that differs from the length of the first interferometer arm 4, can be influenced by an interaction site 6. The second interferometer arm 5 is influenced at this interaction site 6 in such a manner that a wanted signal, which, for example, comes from a vibration-measuring device, is superimposed over the phase difference signal of both laser signals in the first interferometer arm 4 and the second interferometer arm 5. The influence at the interaction site 6 can, e.g., occur in that the path length that the laser signal has to travel in the second interferometer arm 5 is changed as a function of the wanted signal. The intensity signal at the exit of the interferometer is now the pseudo-heterodyne signal and is essentially made up of periodically repeating sine-shaped sections, which are phase-modulated with the wanted signal. This pseudo-heterodyne output signal of the interferometer is detected with a PIN photo diode 7 and converted into an electric signal.

Figure 2:
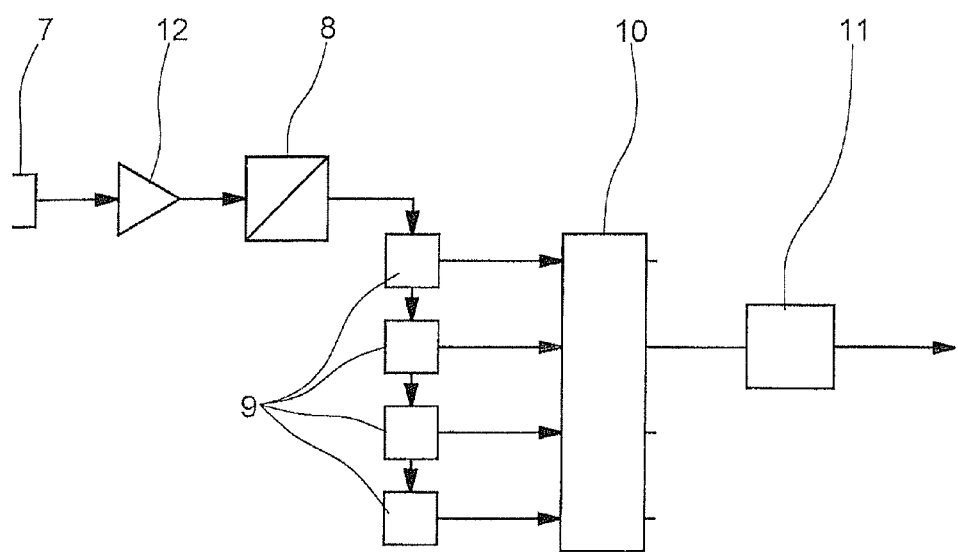

FIG. 2 schematically shows a demodulation method for a preferred embodiment according to the invention in the form of a flow chart. After digitalization of the pseudo-heterodyne signal converted into an electric signal by the PIN photo diode by means of an analog digital converter 8, the pseudo-heterodyne signal is led to a delay chain formed of delay units 9. The sampling rate of the analog digital converter 8 is equal to four times the frequency of the carrier signal here, i.e., the sawtooth signal. Accordingly, four delay units 9 are also provided in the delay chain.

At each sampling step of the analog digital converter 8, the analog digital converter 8 provides a sampling value to the delay unit 9 attached to it. This sampling value is saved in the delay unit 9 attached to it. At the same time, each delay unit 9 provides the next delay unit 9 in the delay chain with the sampling value saved in it and each delay unit 9 in the delay chain saves the sampling value that it received here. After every four sampling steps, all delay units 9 of the delay chain provide their sampling value to the device for fast Fourier transformation 10. The device for fast Fourier transformation 10 calculates only the second Fourier coefficient of the discrete Fourier transformation and provides this to an atan2 function 11.

The atan2 function 11 calculates the phase of the second Fourier coefficients of the discrete Fourier transformation. Since each Fourier coefficient of a Fourier transformation contains phase information, it is sufficient to calculate just one Fourier coefficient. The second Fourier coefficient of the discrete Fourier transformation is the output signal of the demodulation method according to the invention, which is described here as an illustration partially with representational features. The wanted signal can be obtained from the phase of the second Fourier coefficient of the discrete Fourier transformation by means known from the prior art. The wanted signal is, for example, the frequency f of a measuring device based on the detection of mechanical oscillation.

If necessary, the pseudo-heterodyne signal can be amplified by an amplifier 12 before digital sampling by the analog digital converter 8. Additionally or alternatively to amplification, the pseudo-heterodyne signal can be filtered by a low-pass filter (not shown) before digital sampling by the analog digital converter 8.

Figure 3:
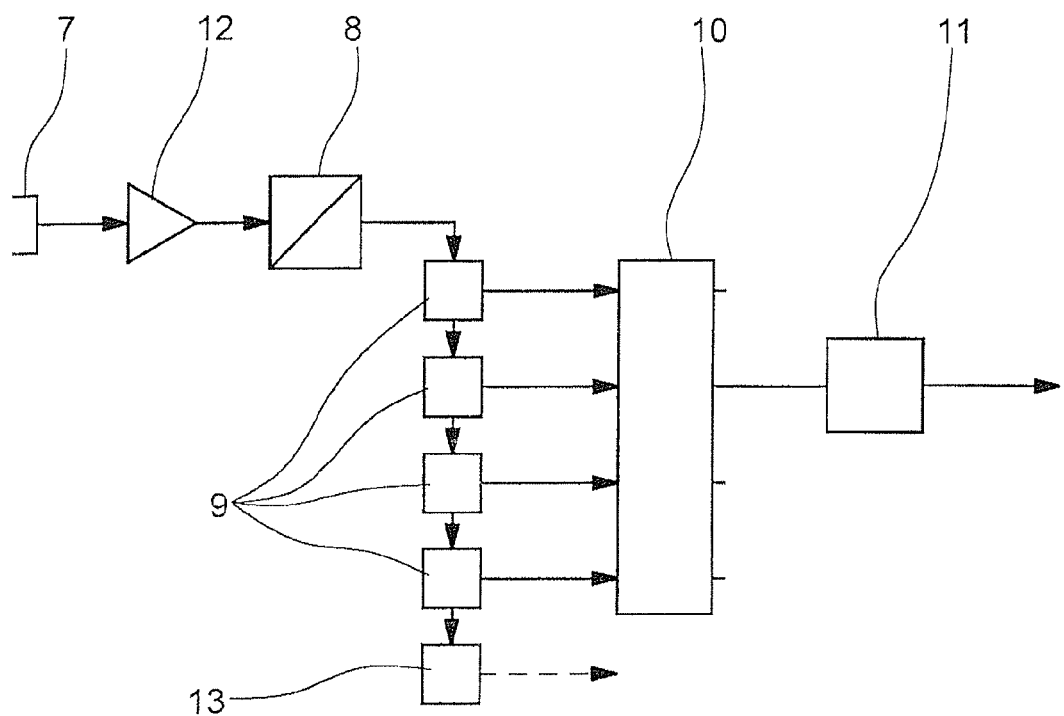

A further advantageous embodiment of the demodulation method according to the invention can be seen schematically in FIG. 3. Structurally, the flow chart in FIG. 3 essentially corresponds to the flow chart in FIG. 2. Just one further delay unit 9 is arranged in the delay chain. As opposed to the demodulation method shown in FIG. 2, the analog digital converter 8 of the demodulation method shown in FIG. 3 functions with 4+1 times the sampling rate of the carrier signal. Hereby, at an assumed same frequency of the carrier signal, five sampling values are determined instead of just four sampling values as in FIG. 2. After every five sampling steps, the delay units 9 of the delay chain provide the sampling values saved within to the device for fast Fourier transformation 10. The sampling value, which is saved in the further delay unit 13, is discarded here. According to the invention, however, exactly this sampling value contains the essential part of the occurring disturbances.

Figure 4:
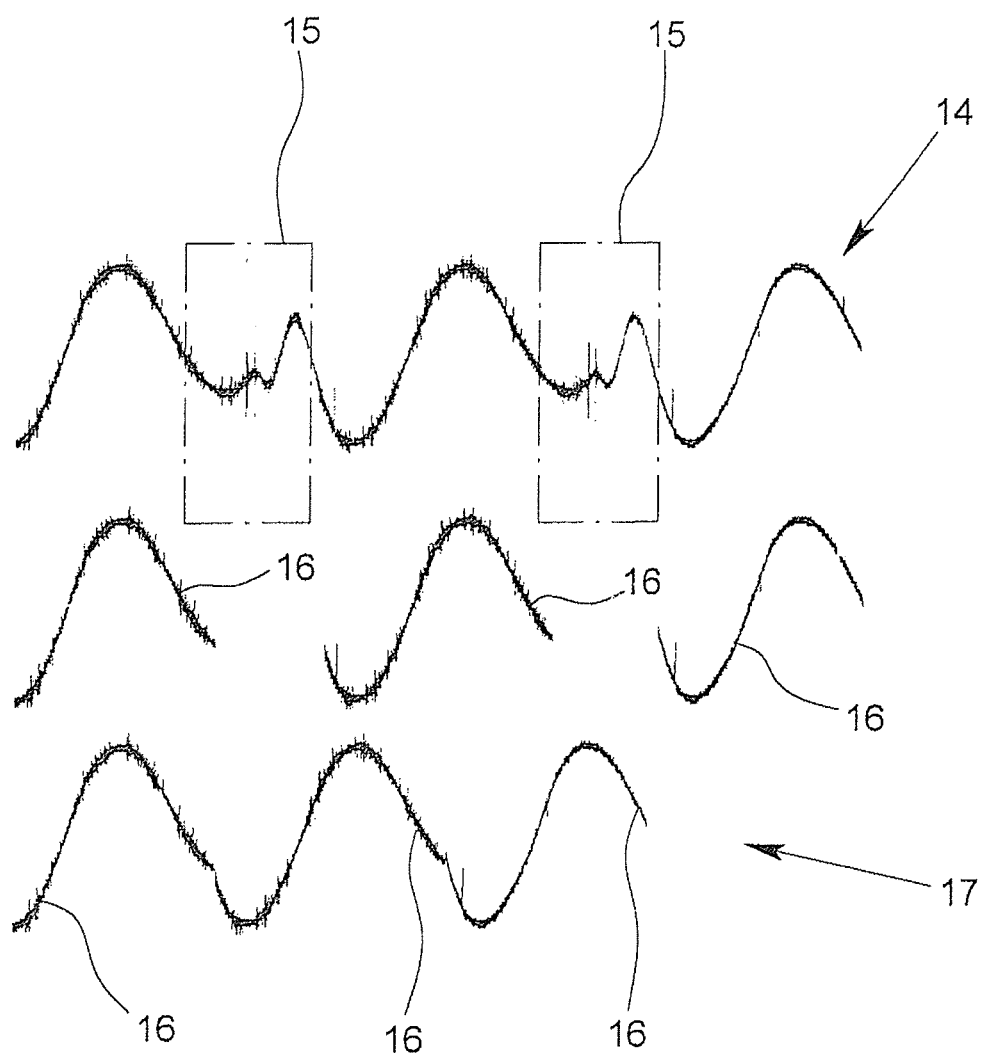
FIG. 4 shows an exemplary application to a pseudo-heterodyne signal of a demodulation method according to a further advantageous embodiment of the invention.

A signal section 14 of a pseudo-heterodyne signal is shown in FIG. 4, which, e.g., is emitted as an electric signal at the exit of a PIN photo diode which receives the intensity signal of a pseudo-heterodyne interferometer. The signal section 14 of the pseudo-heterodyne signal has disturbance ranges 15, which contain disturbances caused by the step response of the amplifier. According to a further preferred embodiment of the demodulation method according to the invention, exactly the sampling steps that correspond to these disturbance ranges 15 are not taken into consideration, i.e., are discarded. This is illustrated in FIG. 4 in that the disturbance ranges 15 in the second row are removed from the signal section 14 of the pseudo-heterodyne signal and the remaining essentially sine-shaped, undisturbed signal sections 16 are put together to a low-disturbance evaluation signal 17 in the third row of FIG. 4.

What is claimed is:

1. Demodulation method for a pseudo-heterodyne signal, comprising the steps of:
    digitally sampling a pseudo-heterodyne signal having a phase-modulated carrier signal,
    subjecting the digitally sampled pseudo-heterodyne signal to a discrete Fourier transformation,
    determining at least one output Fourier coefficient featuring an amplitude and phase,
    applying an atan2 function to exactly one output Fourier coefficient of the discrete Fourier transformation, and
    obtaining the phase of the one output Fourier coefficient from the atan2 function,
    wherein the pseudo-heterodyne signal is created during m oscillations of the carrier signal, the pseudo-heterodyne signal is sampled with an m*n-fold frequency of the carrier signal, m being a natural number greater than zero, n being a natural number greater than one and the discrete Fourier transformation being carried out over m*n sampling steps.

2. Demodulation method according to claim 1, wherein the one output Fourier coefficient is a second Fourier coefficient of the discrete Fourier transformation.

3. Demodulation method according to claim 1, wherein an algorithm for fast Fourier transformation is used for creating the discrete Fourier transformation.

4. Demodulation method according to claim 1, wherein the number n is equal to four.

5. Demodulation method according to claim 4, characterized in that the number m is chosen equal to one.

6. Demodulation method according to claim 1, wherein the pseudo-heterodyne signal is amplified by an amplifier before said digital sampling.

7. Demodulation method according to claim 1, wherein the pseudo-heterodyne signal is filtered by a low-pass filter before digital sampling.

8. Demodulation method according to claim 1, wherein phase steps in the phase of said one output Fourier coefficient are removed by phase unwrapping.

9. Demodulation method for a pseudo-heterodyne signal, comprising the steps of:
    digitally sampling a pseudo-heterodyne signal having a phase-modulated carrier signal,
    subjecting the digitally sampled pseudo-heterodyne signal to a discrete Fourier transformation,
    determining at least one output Fourier coefficient featuring an amplitude and phase,
    applying an atan2 function to exactly one output Fourier coefficient of the discrete Fourier transformation, and
    obtaining the phase of the one output Fourier coefficient from the atan2 function
    wherein the pseudo-heterodyne signal is created during (m+p/n)-oscillations of the carrier signal and the pseudo-heterodyne signal is sampled with the m*n+p-fold frequency of the carrier signal, m being a natural number greater than zero, n being a natural number greater than one, p being a natural number greater than zero, and the discrete Fourier transformation being carried out over m*n sampling steps with the first p sampling steps being discarded.

10. Demodulation method according to claim 9, wherein the number n is equal to four.

11. Demodulation method according to claim 10, characterized in that the number m is equal to one.

12. Demodulation method according to claim 11, wherein the number p is equal to one.

* * * * *